United States Patent
Katti

(10) Patent No.: US 7,023,724 B2
(45) Date of Patent: Apr. 4, 2006

(54) PSEUDO TUNNEL JUNCTION

(75) Inventor: Romney R. Katti, Maple Grove, MN (US)

(73) Assignee: Honeywell International Inc., Morristown, NJ (US)

( * ) Notice: Subject to any disclaimer, the term of this patent is extended or adjusted under 35 U.S.C. 154(b) by 184 days.

(21) Appl. No.: 10/754,881

(22) Filed: Jan. 10, 2004

(65) Prior Publication Data

US 2005/0152178 A1   Jul. 14, 2005

(51) Int. Cl.
*G11C 11/00* (2006.01)
(52) U.S. Cl. ........................ 365/158; 365/171
(58) Field of Classification Search ............... 365/158, 365/171, 173
See application file for complete search history.

(56) References Cited

U.S. PATENT DOCUMENTS

| | | | |
|---|---|---|---|
| 6,185,079 B1 * | 2/2001 | Gill ........................ 360/324.2 |
| 6,522,573 B1 | 2/2003 | Saito et al. .................. 365/158 |
| 6,577,529 B1 * | 6/2003 | Sharma et al. ............... 365/158 |
| 6,826,023 B1 * | 11/2004 | Hayakawa ................ 360/324.2 |
| 6,912,152 B1 | 6/2005 | Iwata et al. .................. 365/158 |
| 2003/0174537 A1 | 9/2003 | Bloomquist et al. ......... 365/171 |
| 2005/0152181 A1 * | 7/2005 | Katti ........................... 365/158 |

FOREIGN PATENT DOCUMENTS

WO   WO 2004/039424 A2   1/2004

OTHER PUBLICATIONS

Slaughter, "Magnetic Tunnel Junction Materials for Electronic Applications,"JOM (Jun. 2000). (www.tms.org/pubs/journals/JOM/0006/Slaughter/Slaughter-0006.html).
Daughton, "Magnetoresistive Random Access Memory (MRAM)," pp1-13 (Feb. 4, 2000).
International Search Report dated Nov. 7, 2005.

* cited by examiner

*Primary Examiner*—Anh Phung
(74) *Attorney, Agent, or Firm*—McDonnell Boehnen Hulbert & Berghoff LLP

(57) ABSTRACT

The present invention provides for a tunneling magnetoresistive element and a method of reading a logical state of the element. An embodiment of the magnetoresistive element, for example, provides a tri-layer device having a storage layer, a sense layer and a barrier layer. The storage layer is a conducting, magnetic layer having a magnetization direction along an easy axis of the element. The storage layer is configured such that its magnetization direction will invert in response to an externally applied magnetic field of at least a first threshold strength. The binary state of the tunneling element is determinable from the magnetization direction of the storage layer. The sense layer is also a conducting, magnetic layer having a magnetization direction along the easy axis of the element. The sense layer is configured such that its magnetization direction will invert in response to an externally applied magnetic field of at least a second threshold strength. The sense layer is designed with a lower coercivity than the storage layer, thus the second threshold strength is less than the first threshold strength.

23 Claims, 7 Drawing Sheets

PSEUDO TUNNEL JUNCTION

GOVERNMENT RIGHTS

The United States Government has acquired certain rights in this invention pursuant to Contract No. DTRA01-00-C-0002 awarded by DTRA.

BACKGROUND

1. Field

The present invention relates generally to magnetic memory and more specifically to tunneling magnetoresistive devices.

2. Related Art

Many advances in memory technology have been made in recent years. One such advance is the magnetic tunnel junction (MTJ) that makes use of the tunneling magnetoresistive effect to store binary information. MTJs are favored because they provide high data read speeds, are nonvolatile, and have a high magnetoresistive ratio. The basic structure of the MTJ is shown in FIG. 1 as a tri-layer device having a barrier layer 16 sandwiched between magnetic (ferromagnetic) layers 12 and 14. Each magnetic layer has an associated magnetization direction.

In a typical arrangement, one of the magnetic layers is configured to be a fixed layer 14. An anti-ferromagnetic layer (not shown) may be useful in fixing the magnetization direction of the fixed layer. In practice the fixed layer may alternatively be designed with a higher coercivity. Thus, the fixed layer is treated substantially like a permanent magnet with a permanent direction. The single headed arrow in layer 14 indicates that layer 14 is a fixed layer with a fixed magnetic direction. A second magnetic layer is termed a free layer 12. The free layer 12 is configured to switch the direction of its magnetization in response to a sufficient externally applied magnetic field. The double headed arrow at free layer 12 indicates that the magnetization direction of the free layer 12 may be inverted by an applied magnetic field.

In order to store binary data, the MTJ must have two possible logical states (i.e. binary states). These states are often referred to as "1" and "0." The state of the MTJ is defined by whether the magnetization directions of the two magnetic layers 12 and 14 are parallel or anti-parallel. If the magnetization directions the two magnetic layers 12 and 14 are the same then they are said to be parallel. Alternatively, if the magnetization directions of the two magnetic layers are opposite, they are said to be anti-parallel.

The tunneling magnetoresistive effect is based on the phenomena that an applied magnetic field can influence the resistivity of a material. In simple terms, the resistance to a current passing through the MTJ is "high" when the magnetization directions of the magnetic layers are anti-parallel and "low" when the magnetization directions are parallel. Usually, the resistivity of an MTJ is determined by measuring a read current passed perpendicularly through each layer of the MTJ. A read current (i) is shown passing perpendicularly through the layers of FIG. 1. Because of the direction of read current flow, an MTJ is termed a current perpendicular to plane (CPP) device.

One measure for the quality of an MTJ is its magnetoresistive ratio defined as ($\Delta R/R_{min}$). $\Delta R$ is defined as the difference between the resistivity of the MTJ when the magnetization directions are anti-parallel and the resistivity of the MTJ when the magnetization directions are parallel, while $R_{min}$ is the resistivity of the MTJ when the magnetization directions are parallel (minimum resistivity).

In general, a current flowing through a wire produces a magnetic field. The direction of the magnetic field is perpendicular to the direction of current flow and follows the "right hand rule." When writing to the MTJ, the magnetization direction of the free layer 12 is switched by applying a magnetic field to the MTJ. Usually, a pair of conducting lines running perpendicularly to one another are used to apply the external magnetic field to the MTJ by passing currents through each line. These lines may be termed a bit line and a digit line. The bit line may also be used to apply the read current.

The pseudo spin valve (PSV) is a second memory technology that uses the magnetoresistive effect to store data in a nonvolatile form. Unlike the MTJ, the PSV involves a conducting nonmagnetic layer (typically copper) sandwiched between two magnetic (ferromagnetic) layers. The basic structure of the PSV is shown in FIG. 2 as a tri-layer device having a conducting spacer layer 26 separating a magnetic sense layer 22 from a magnetic storage layer 24. Each of the two magnetic layers has an associated magnetization direction. The logical state of the PSV is determined by the magnetization direction of the reference layer.

In the PSV, the storage layer 24 is configured to switch its magnetization direction in response to the application of a magnetic field of at least a first threshold. Likewise, the sense layer 22 will switch its magnetization direction in response to the application of a magnetic field of at least a second threshold. The first threshold is generally higher than the second threshold—thus the magnetization direction of the sense layer 22 is easier to switch than the magnetization direction of the reference layer 24. Because the storage layer 24 has a higher switching threshold than the sense layer 22, the storage layer 24 is said to have a higher coercivity than sense layer 22. The storage layer 24 is shown in FIG. 2 as thicker than the sense layer 22 as an indication of higher coercivity. The double headed arrow at both sense layer 22 and storage layer 24 indicate that the respective magnetization directions of the layers may be inverted by an applied magnetic field.

Because the logical state of the PSV is determined by the magnetization direction of the reference layer, during a write sequence, a magnetic field of at least the second threshold must be applied to the PSV in order to switch its logical state. During a read sequence, a read current (i) is passed through the PSV. Typically, the majority of the read current (i) flows within the conducting spacer layer 26 because its electrical conductivity is greater than that of the sense and storage layers 22 and 24. Sense lines (not shown) may be coupled to opposing ends of the element for passing the read current (i) through the PSV. Because the read current flows parallel to the layers, a PSV is known as a current-in-plane (CIP) device.

SUMMARY OF THE INVENTION

The present invention provides for a novel tunneling magnetoresistive element and a method of reading a logical state of the element.

In a first aspect, a magnetoresistive tunneling element for storing data provides a tri-layer device having a storage layer, a sense layer and a barrier layer. The storage layer is a conducting, magnetic layer having a magnetization direction along an easy axis of the element. The storage layer is configured such that its magnetization direction will invert in response to an externally applied magnetic field of at least a first threshold strength. The binary state of the tunneling element is determinable from the magnetization direction of the storage layer.

The sense layer is also a conducting, magnetic layer having a magnetization direction along the easy axis of the element. The sense layer is configured such that its magnetization direction will invert in response to an externally applied magnetic field of at least a second threshold strength. The sense layer is designed with a lower coercivity than the storage layer, thus the second threshold strength is less than the first threshold strength. The difference in coercivity may, for example, be achieved by differing the thickness of the layers or by altering the material composition of the layers. The barrier layer is a nonmagnetic nonconducting barrier layer sandwiched between the storage layer and the sense layer.

The presently described embodiment may also provide for a pair of current drivers for applying a magnetic field to the element. The current drivers are configured to generate a first magnetic field during a read sequence with a strength between the first and second threshold strengths for inverting the magnetization direction of the sense layer. The current drivers are also configured to generate a second magnetic field during a write sequence with a strength greater than the first threshold strength for inverting the magnetization field of the storage layer.

A second aspect provides a method of reading a binary state of a storage layer of a tunneling magnetoresistive element. A first magnetic field is applied in a first direction to a sense layer of the element, and a first voltage is applied perpendicularly across a barrier layer of the tunneling element for obtaining a first metric indicative of a first resistivity of the tunneling element. Further, a second magnetic field is applied in a second direction to a sense layer of the element, and a second voltage is applied perpendicularly across the layers of the tunneling element for obtaining a second metric indicative of a second resistivity of the tunneling element. The binary state of the storage layer is then determinable from the two metrics. In a preferred embodiment, the magnetization direction of the storage layer is held constant during the application of the magnetic fields.

A third aspect provides a method of reading a magnetoresistive memory element. A magnetic field is applied to the element to ensure that the magnetization direction of a sense layer of the element is in a first state. A voltage is then applied across a barrier layer of the element and the logical state of the element determined.

The resistivity of the element is dependant upon whether a magnetization layer of the sense layer is parallel or anti-parallel to a magnetization direction of the storage layer. Because the magnetization direction of the sense layer is set to a known direction (first state), a low resistivity indicates that the storage layer is also in the first state. Likewise, a high resistivity indicates that the storage layer is in a second (inverted) state. The state of the storage layer is indicative of the logical state of the element.

DETAILED DESCRIPTION

1. Overview

Figure 1:
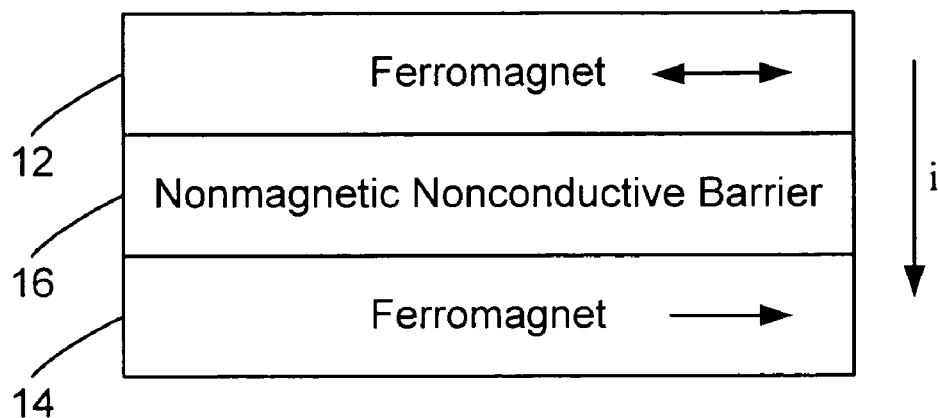
FIG. 1 is a schematic diagram of the layers of a prior art magnetic tunneling junction (MTJ) element.
Figure 2:
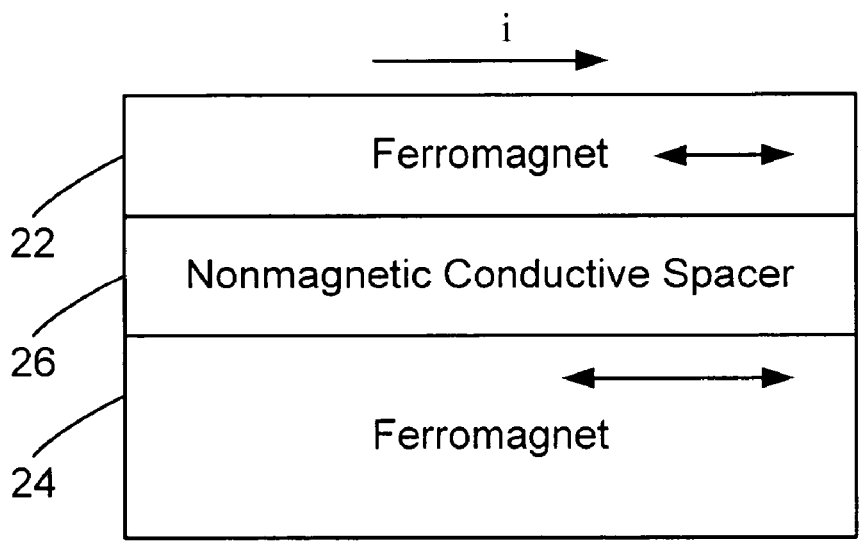
FIG. 2 is a schematic diagram of the layers of a prior art pseudo spin valve (PSV) element.
Figure 3A:
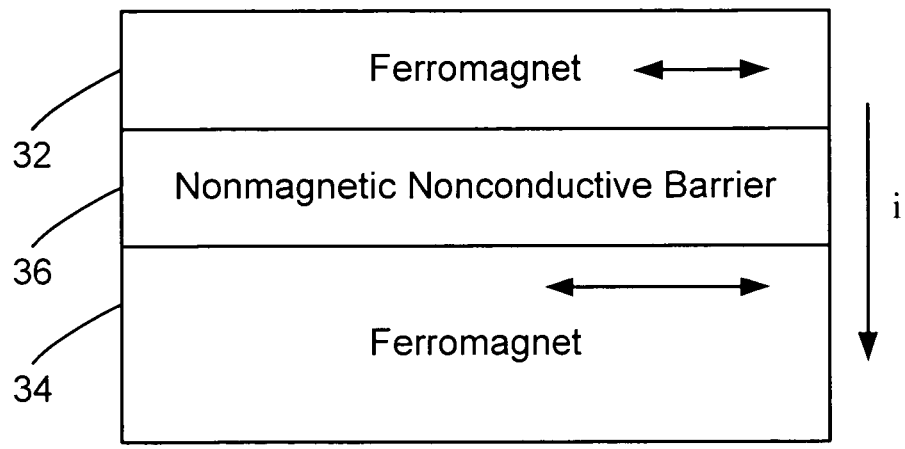
FIG. 3a is a schematic diagram of an embodiment of a tunneling magnetoresistive element.

Referring to the drawings, FIG. 3a is a schematic diagram of a novel tunneling magnetoresistive element. A nonmagnetic nonconducting barrier layer 36 is shown sandwiched between a ferromagnetic sense layer 32 and a ferromagnetic storage layer 34. A read current (i) is shown flowing perpendicularly across the layers of the element. The double headed arrow at both sense layer 32 and storage layer 34 indicate that the respective magnetization directions of the layers may be inverted by an applied magnetic field.

The barrier layer 36 is preferably a thin film insulator. During a read sequence, a current is passed through the barrier layer 36. According to classical physics, this operation is not possible because the resistance across the barrier layer 36 should be infinity. However, at a nanometric scale, a tunneling current may flow in such a structure. The barrier layer may, for example, be manufactured by deposition on one of the ferromagnetic layer of a 1–2 nm thickness film of Al or Mg. The film is then oxidized to obtain an $Al_2O_3$ or MgO insulation layer. Various techniques of oxidation are applicable, for example plasma oxidation, thermal oxidation, oxygen glow discharge or direct deposition of $Al_2O_3$. Epitaxially grown barrier layers may also be incorporated in the present invention. For example, an MgO barrier layer may be elaborated by molecular beam epitaxy with a barrier layer thickness of approximately 0.8 nm. Care must be taken when producing the barrier layer to avoid pinholes and other impurities that could serve to electrically or magnetically couple the two ferromagnetic layers 32 and 34.

In an exemplary embodiment, the two ferromagnetic layers 32 and 34 that bound two sides of the barrier layer 36 are magnetically uncoupled from one another, and are designed to exhibit switching behavior similar to a pseudo spin valve. The two ferromagnetic layers are designed with different coercivities. For example, the storage layer 34 is shown as thicker than the sense layer 32 to indicate a greater coercivity. Because a read sequence involves passing the read current (i) perpendicularly through the plane of each layer, each magnetic layer of the element must be an electrical conductor. As an example, the magnetic layers may be NeFe alloys.

Figure 3B:
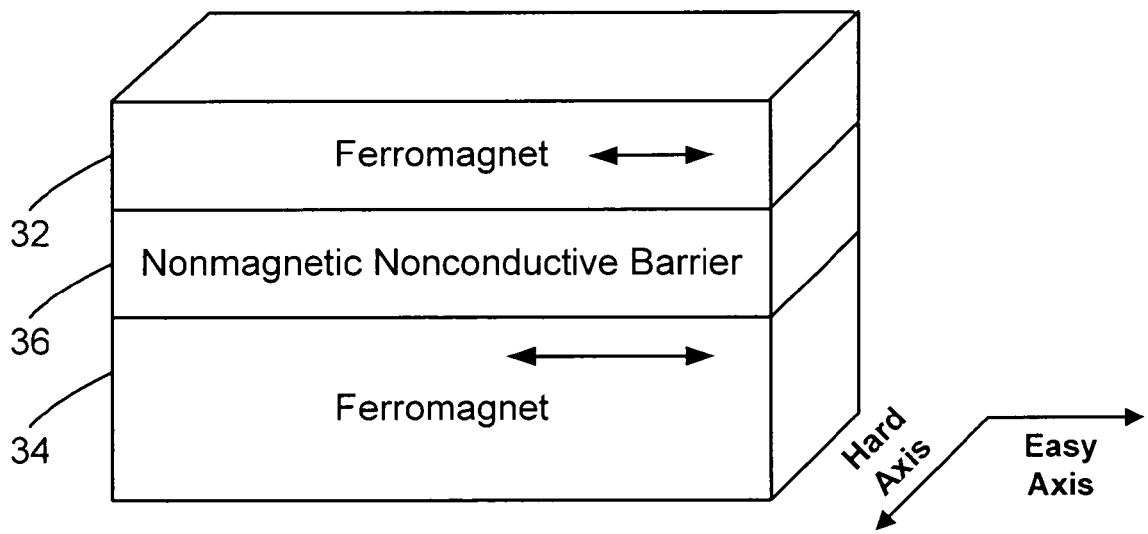
FIG. 3b is an isometric view of an embodiment of a tunneling magnetoresistive element.

FIG. 3b shows a three dimensional view of the tunneling magnetoresistive element of FIG. 3a. In the exemplary embodiment, the element has a hard axis (short axis) and an easy axis (long axis). In general, the magnetization direction of both the sense layer 32 and the storage layer 34 run substantially parallel to the easy axis of the element.

2. Exemplary Architecture

Figure 4A:
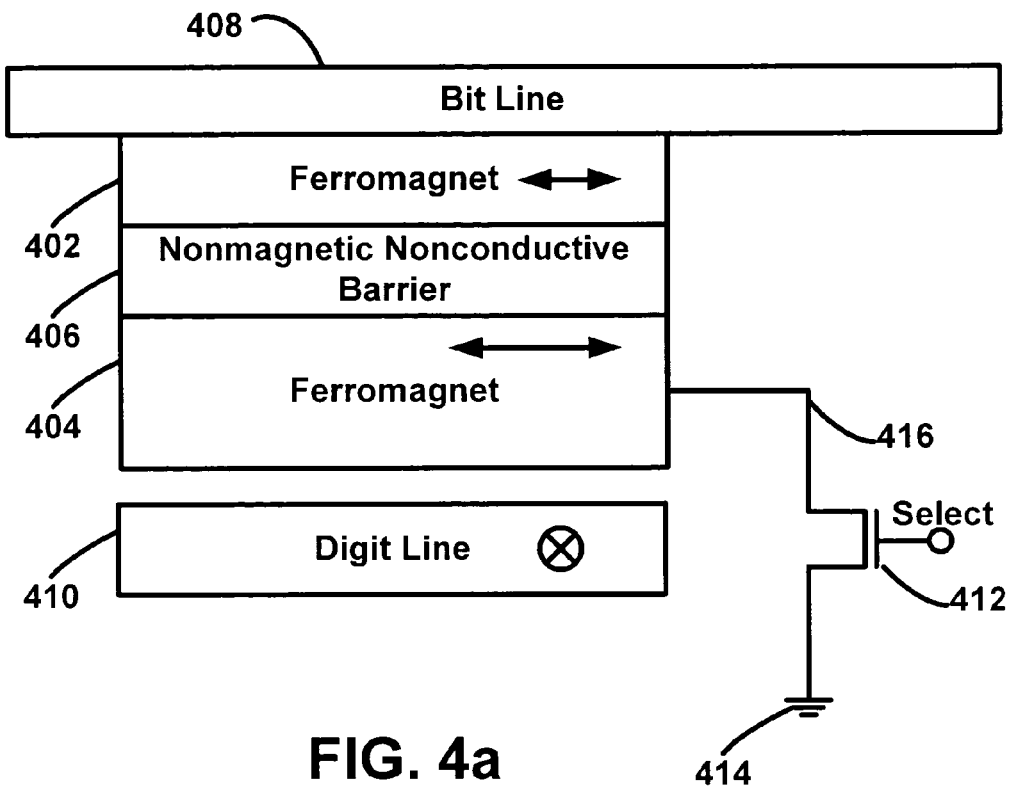
FIG. 4a is a schematic diagram of an embodiment of a tunneling magnetoresistive cell.

FIG. 4a shows a schematic diagram of an exemplary architecture of a cell in a memory device. A nonmagnetic nonconducting barrier layer 406 is deposited between a conducting ferromagnetic sense layer 402 and a conducting ferromagnetic storage layer 404. Both the sense layer 402 and the storage layer 404 are free to invert their magnetization directions in response to an applied magnetic field. However, inversion of the magnetization direction of the storage layer 404 requires a larger magnetic field than does inversion of the magnetization direction of the sense layer 402. A bit line 408 is electrically coupled to the sense layer 402, and is arranged near the two magnetic layers 402 and 404 such that a current passing through the bit line 408 creates a magnetic field that acts on the two magnetic layers 402 and 404. A digit line 410 is also arranged near the two magnetic layers 402 and 404 such that a current passing through the digit line 410 creates a magnetic field that acts on the two magnetic layers 402 and 404 and preferably aligned perpendicularly to the bit line 408. A gate 412 and a conducting line 416 interconnect the storage layer 404 and a ground 414.

Figure 4B:
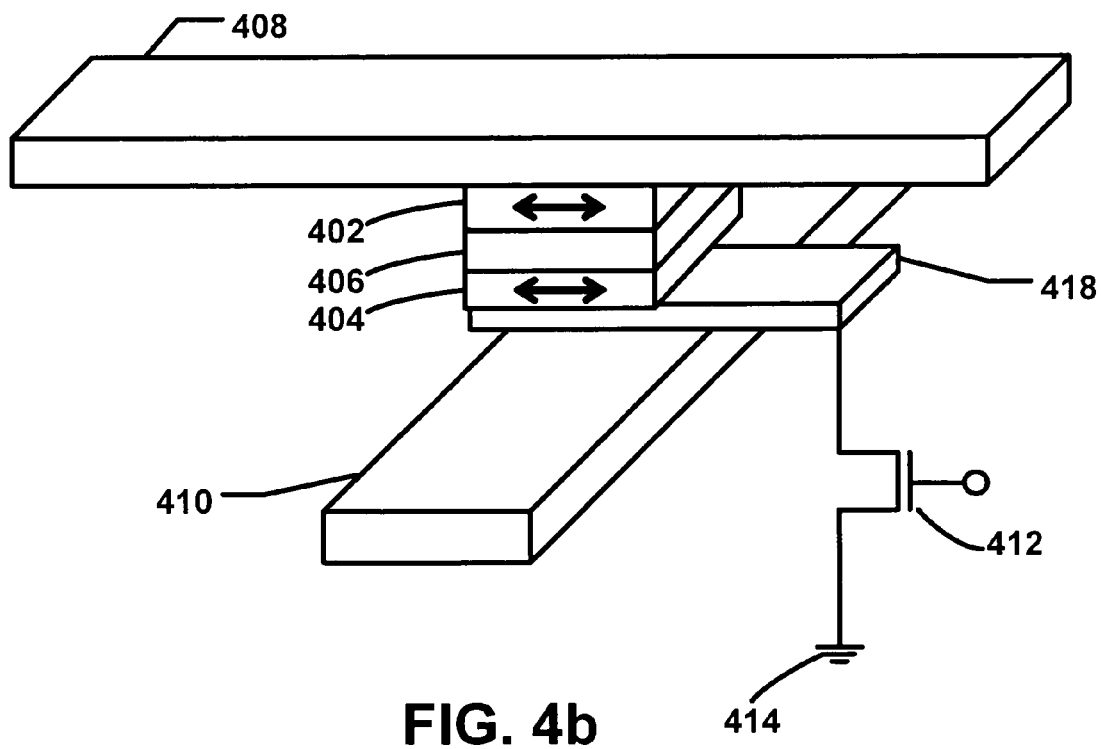
FIG. 4b is an isometric view of an embodiment of a tunneling magnetoresistive cell.

FIG. 4b shows an isometric view of the cell of FIG. 4a with minor modifications. In a preferred embodiment, the bit line 408 is aligned perpendicular to the digit line 410. In one embodiment, the connection between the gate 412 and the storage layer 404 is accomplished through a conducting layer 418 attached to the storage layer 404 as shown in FIG. 4b. In another embodiment, the gate 412 is attached to the conducting line 416 running to the edge of the storage layer 404 as shown in FIG. 4a. In an alternative embodiment, the bit line 408 is coupled to the storage layer 404 and the read transistor is coupled to the sense layer 402.

One use of the presently described embodiment is in a magnetic memory array. In the array, many tunneling magnetoresistive cells are arranged in a set of rows and columns. Each row of magnetoresistive cells may have a bit line that is coupled to each memory cell in the row. Similarly, each column may have a digit line that is arranged near each magnetoresistive cell in the column such that a current in the digit line creates a magnetic field acting at least partially along an easy axis of the memory cells.

In an embodiment of the invention, a pair of current drivers may be configured to generate a first magnetic field with sufficient strength to invert the magnetization direction of the sense layer 402 without inverting the magnetization direction of the storage layer during a read sequence. Likewise, the pair of current drivers may be further configured to generate a second magnetic field with sufficient strength to invert the magnetization direction of the storage layer 404 and the magnetization of the sense layer 402.

3. Exemplary Construction

Again looking at FIG. 4b, the steps of manufacturing of an embodiment of the tunneling magnetoresistive cell are described below. Beginning with a seed layer (not shown) such as Ta, a digit line 410 is deposited on the substrate. After an insulating layer is deposited on the digit line, a conducting layer 418 is deposited for connecting the gate 412 with a storage layer 404. The storage layer 404 is deposited on the conducting layer 418, and a barrier 406 grown upon the storage layer 404. A sense layer 402 is deposited above the barrier layer 406. A bit line 408 is deposited on the sense layer 402 either directly or on an insulator (not shown) that interconnects the bit line to the sense layer through a via. The bit line 408 and digit line 410 may be arranged to run in a matrix of rows and columns in which contacts are made to access transistors (not shown) for controlling current flow in the lines (408 and 410). A cap layer (not shown), such as of Ta, may also be provided as well as an etch stop such as CrSi or TiN.

A magnetic layer of the element may be designed as a single layer, a bilayer, or a multilayer. A single layer, for example, may be constructed of NiFe or NiFeCo. Alternatively, a bilayer, such as NiFe/CoFe may be used. More generally, a multilayer of various ferrous alloys may be used (a bilayer is a form of multilayer). The device may be grown by sputtering, ion beam deposition, plasma vapor deposition, evaporation, or epitaxially, for example. Patterning can be by wet chemical etching, dry etching, ion milling, or reactive etching, for example.

4. Logical States of the Elements

Figure 5:
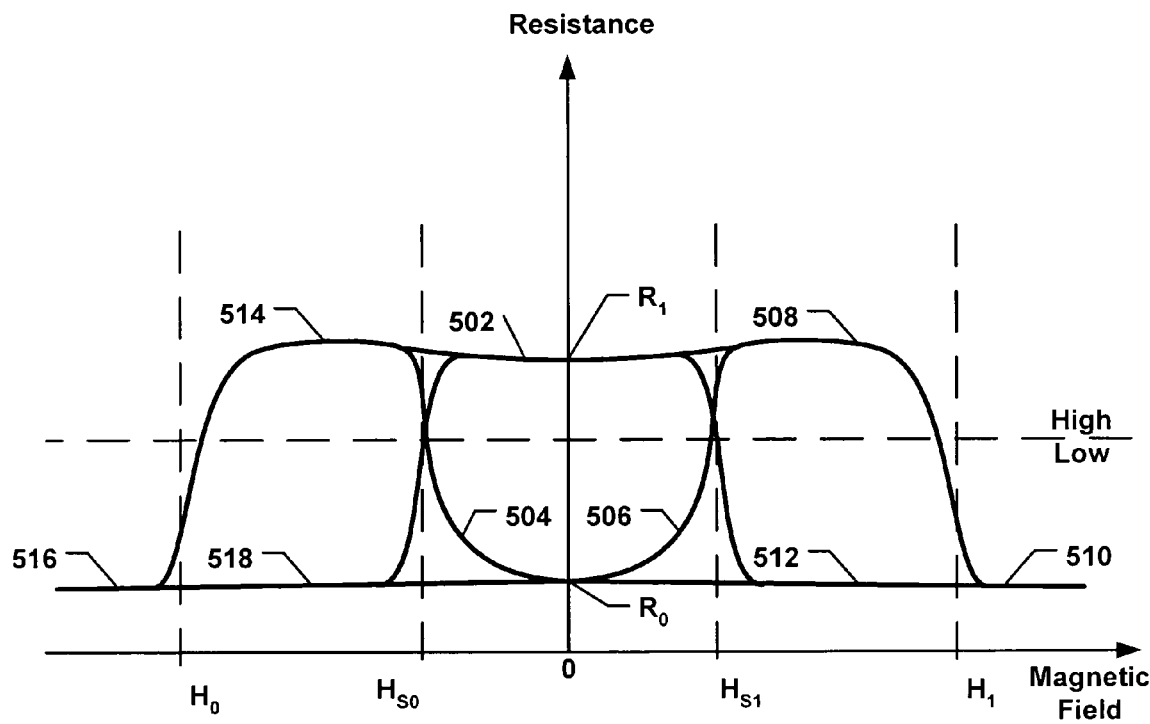
FIG. 5 is a hysteresis curve of an embodiment of a tunneling magnetoresistive element.
Figure 5:
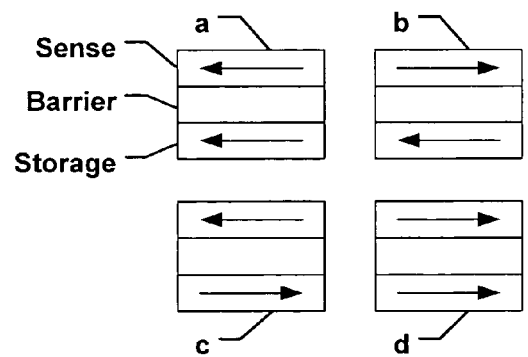

FIG. 5 is a graph of a hysteresis curve of an embodiment of a tunneling magnetoresistive element such as that shown in FIG. 3a. The horizontal axis represents the magnitude and direction of a magnetic field applied to the easy axis of the magnetoresistive element. Values along the positive horizontal axis represent a magnetic field in a first direction along the easy axis of the magnetoresistive element while values along the negative side of the horizontal axis represent a magnetic field in the opposite direction (also along the easy axis). The origin of the horizontal axis represents zero applied magnetic field (also known as zero-field), this is demonstrated by a zero (0) label. Properties of the magnetoresistive element that exist at zero-field are thought of as stable or nonvolatile because no field is required to maintain their value.

The vertical axis represents the resistance exhibited by the magnetoresistive element. The resistance, for example, may be measured as the resistance associated with passing a current perpendicularly across a barrier layer of the magnetoresistive element. In one embodiment, the magnetic field shown by the horizontal axis is a composite magnetic field created by two currents passing through lines arranged near the magnetoresistive element.

Because the magnetoresistive element has two possible magnetization directions fore each of the two uncoupled magnetic layers, there are four possible magnetization states. The four possible magnetization states are shown below the graph in elements (a), (b), (c), and (d). In each of the elements (a)–(d), the top layer represents a sense layer, the middle layer represents a barrier layer and the bottom layer represents a storage layer. Single headed arrows in both the sense layer and storage layer represent the magnetization directions of the layer. For example, in element (a), both the sense layer and the storage layer have magnetization directions pointing towards the left. Conversely, in element (b), the sense layer has a magnetization direction pointing to the right while the storage layer has a magnetization direction pointing to the left. For clarity, a magnetization direction pointing to the right represents a first magnetization direction, and a magnetization direction pointing to the left represents a second magnetization direction.

Looking again along the magnetic field axis (horizontal axis) of FIG. 5, $H_{s1}$ represents the application of a magnetic field that is just strong enough to switch the magnetization direction of the sense layer to the first magnetization direction. Obviously, if the magnetization direction of the sense layer is already in the first direction, then application of the $H_{s1}$ magnetic field will not cause a further switch. Looking further in the first direction, $H_1$ represents the application of a magnetic field that is just strong enough to switch the magnetization direction of the storage layer to the first magnetization direction. $H_{s0}$ represents the application of a magnetic field that is just strong enough to switch the magnetization direction of the sense layer to the second magnetization direction. Likewise, $H_0$ represents the application of a magnetic field that is just strong enough to switch the magnetization direction of the storage layer to the second magnetization direction. In a preferred embodiment, $H_1$ and $H_0$ are of equal magnitude but opposite directions. Similarly, in a preferred embodiment, $H_{S1}$ is of equal magnitude but opposite direction of $H_{S0}$. In practice, a magnetic field should be applied that is greater than the thresholds mentioned to ensure a higher probability of proper switching.

As can be seen from the graph, there are two possible zero-field resistance measures ($R_1$ and $R_0$). $R_1$ represents a higher resistance across the barrier layer than does $R_0$. As mentioned, the resistance of the tunneling element is "high" when the magnetization directions of the two magnetic layers are anti-parallel and "low" when the magnetization directions are parallel. Thus, the "high" zero-field resistance of $R_1$ is created by opposing (anti-parallel) magnetization directions as seen in elements (b) and (c). The "low" zero-field resistance of $R_0$ is created by parallel magnetization directions as seen in elements (a) and (d).

When a magnetic field of strength greater than $H_{S1}$ is applied to the element, the magnetization direction of the sense layer switches to a first magnetization direction. Thus, at point 508, the magnetization directions are anti-parallel as in element b. Likewise at point 512, the magnetization directions are parallel as in element (d). When a magnetization field of strength greater than $H_1$ is applied to the element, the magnetization direction of both the sense layer and the storage layer are switched to a first magnetization direction as shown in element (d).

When a magnetic field of strength greater than $H_{S0}$ is applied to the element, the magnetization direction of the sense layer switches to a second magnetization direction. Thus, at point 514, the magnetization directions are anti-parallel as in element (c). Likewise at point 518, the magnetization directions are parallel as in element (d). When a magnetization field of strength greater than $H_0$ is applied to the element, the magnetization direction of both the sense layer and the storage layer are switched to a second magnetization direction as shown in element (a).

The magnetization direction of the storage layer is indicative of the logical state of the element. Thus, when the magnetization direction of the storage layer is in a first direction, as in elements (c) and (d), the element is in a first logical state. Likewise, when the magnetization direction of the storage layer is in a second direction, as in elements (a) and (b), the element is in a second logical state.

In one embodiment, the magnetization hysteresis loop of the magnetoresistive element is substantially unbiased. Such an unbiased hysteresis loop is shown by FIG. 5. Additionally, the hysteresis loops of the individual layers (sense and storage) should be substantially unbiased. FIG. 5 is meant to show an example of a hysteresis loop. Although the overall structure may be consistent across various embodiments, the specific path of the arcs and curves of FIG. 5 should not be seen as limiting and will depend upon various design parameters.

5. Exemplary Write Sequence

An exemplary write sequence is outlined below for an embodiment such as that shown in either FIGS. 4a and 4b. In order to switch the logical state of a magnetoresistive element, a magnetization direction of a storage layer of the element must be switched. The magnetization direction of the storage layer is switched by applying a magnetic field to the element of sufficient strength. Thus, in order to switch the element to a first logical state, a magnetic field of at least $H_1$ strength must be applied to the storage layer. Conversely, in order to switch the element to a second logical state, a magnetic field of at least $H_0$ strength must be applied to the storage layer.

Figure 6:
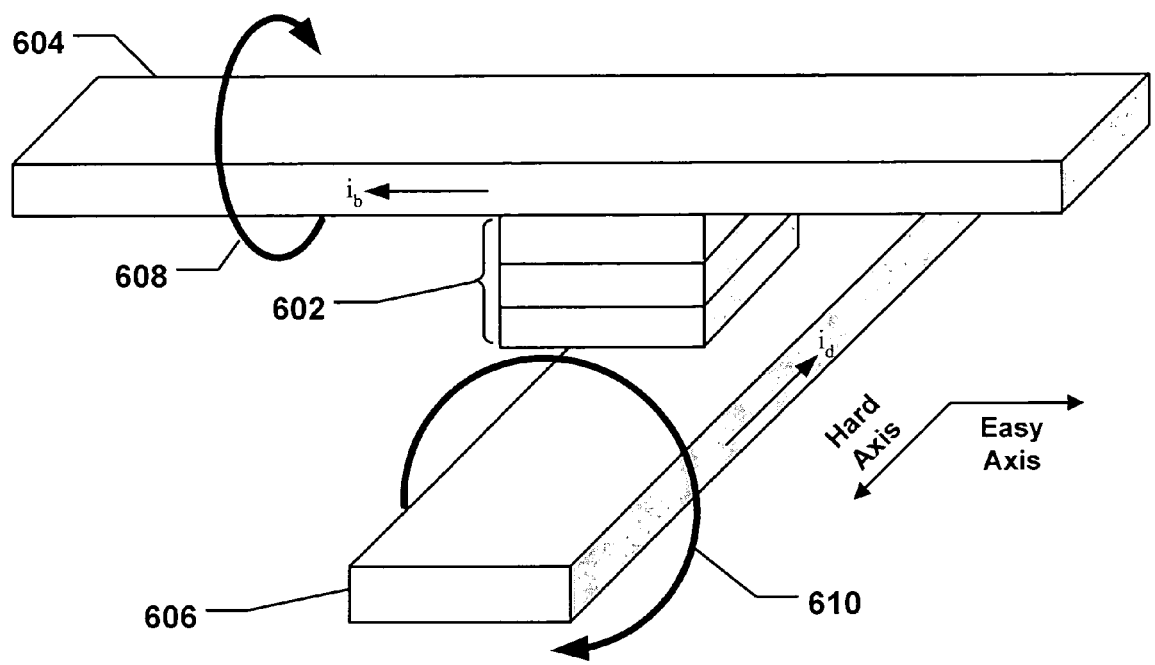
FIG. 6 is an isometric view of a magnetoresistive cell showing magnetic fields.

Referring now to FIG. 6, a bit line 604 is coupled to a tunneling magnetoresistive element 602. A digit line 606 is arranged near the magnetoresistive element 602, but is electrically isolated from the element 602. A magnetic field used to switch the magnetization direction the storage layer is created by a bit current ($i_b$) flowing through the bit line 604 acting in combination with a digit current ($i_d$) flowing through the digit line 606. Each current creates a magnetic field (606 and 608) acting perpendicularly to the current flow. The two magnetic fields (606 and 608) form a combined magnetic field that acts on the storage layer of the element. An embodiment provides that the combined magnetic field is the magnetic field shown by the horizontal axis of FIG. 5.

In one embodiment, the bit line 604 creates a magnetic field along the hard axis of the element that acts to lower the switching threshold of the element, and the digit line 608 creates a magnetic field along the easy axis of the element that acts to switch the magnetization direction of the element. Although the magnetoresistive element 602 is shown positioned orthogonally to the bit line and the digit line, this positioning is not required. In an embodiment, for example, the magnetoresistive element is rotated by 30 degrees to achieve a better switching performance.

6. Exemplary Read Sequence

A read sequence of an embodiment such as that shown in FIGS. 4a and 4b is described below. In a preferred embodiment, the tunneling magnetoresistive element is a current perpendicular to plane (CPP) device. In other words, a read current passed is passed perpendicularly through across the layers of the magnetoresistive element in order to determine the logical state of the magnetoresistive element.

Figure 7:
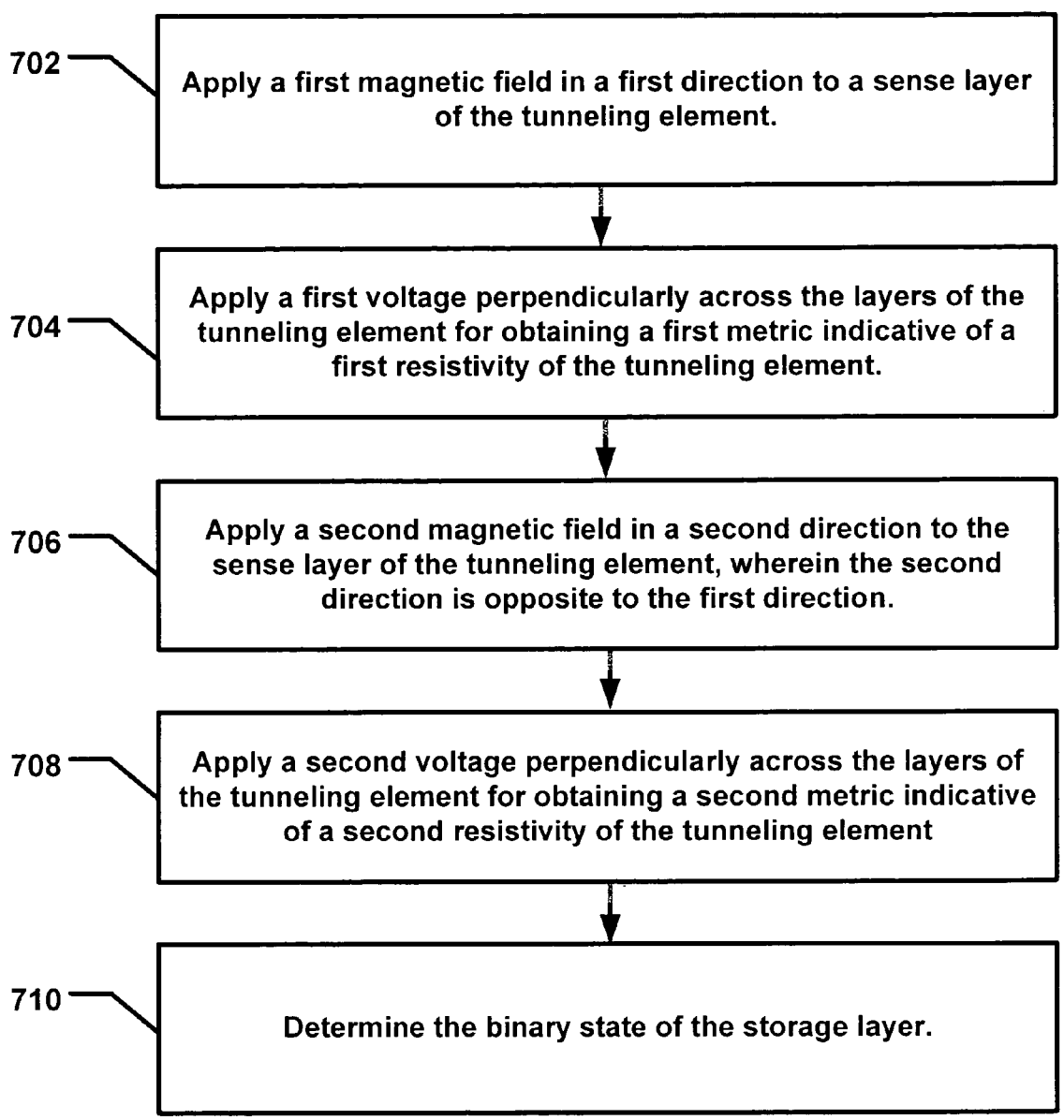
FIG. 7 is a process flow diagram of a method of reading a binary state.

FIG. 7 shows a process for determining the binary state of the storage layer of the magnetoresistive element. In step 702, a first magnetic field is applied in a first direction to a sense layer of the tunneling element. The first magnetic field may be created in a similar fashion to the magnetic fields used in the exemplary write sequence. For example, currents passing through both a bit line and a digit line may create a composite magnetic field that acts on the sense layer of the element. In a preferred embodiment, the strength of the first magnetic field should be sufficient to place the magnetization direction of the sense layer in a first magnetization direction without switching the magnetization direction of the storage layer. In an alternative embodiment, the first magnetic field is generated by a current passing through the digit line without passing a current through the bit line. Referring to FIG. 5, the first magnetic field should have a greater magnitude than $H_{s1}$ but have a smaller magnitude than $H_1$.

In one embodiment, a first end of the bit line is connected to a bit power source through a first bit selector, and a second end of the bit line is connected to a ground sink through a second bit selector. Thus, passing a current through the bit line involves selecting the bit line with both the first bit selector and the second bit selector—thus allowing a current to pass from the bit power source to the ground sink.

Applying a current to the digit line may take the same form.

At step 704, a first voltage is applied perpendicularly across the layers of the tunneling element. The voltage is used to obtain a first metric that is indicative of a first resistivity of the tunneling element. The first metric may, for example, be either a value for the voltage required to pass a predefined current across the element or a value for the current created in the element by a predefined voltage being applied across the element. These values may be measured with, for example, a voltmeter or ammeter.

The first voltage may be created by closing a switch that interconnects the bit line with a power source and by closing a gate that interconnects the magnetoresistive element to a ground. Thus, a current arc is created flowing from the current source through the magnetoresistive element to the ground. In another embodiment, applying the first voltage comprises applying a voltage to bit line that is coupled to a first side of the magnetoresistive element and closing a drain switch that is interconnected between a second side of the tunneling element and a ground sink. In this embodiment, a current passing from the first side of the magnetoresistive element to the second side of the magnetoresistive element pass through the barrier layer of the tunneling element. The drain switch may be controllable by a select line that is attached to the drain switch such that the drain switch is closed when a voltage is applied to the select line.

At step 706, a second magnetic field is applied to the sense layer in a second direction such that the second magnetization direction is opposite to the first direction. In the preferred embodiment, the second magnetic field should be of sufficient strength to switch the magnetization direction of the sense layer to the second magnetization direction without switching the magnetization direction of the storage layer. Referring to FIG. 5, the second magnetic field should have a greater magnitude than $H_{s0}$ but have a smaller magnitude than $H_0$.

At step 708, a second voltage is applied perpendicularly across the layers of the tunneling element in order obtain a second metric that is indicative of a second resistivity of the tunneling element.

The binary state of the storage layer is determined at step 710. Because the binary state of the storage layer is indicative of the logical state of the tunneling element, the logical state of the tunneling element may also be determined. In one embodiment, determining the binary state of the storage layer is accomplished by comparing the first metric to the second metric. If, for example, the first metric shows a "low" resistivity and the second metric shows a "high" resistivity, then the magnetization direction of the storage layer is in the first magnetization direction. If, however, the first metric shows a "high" resistivity and the second metric shows a "low" resistivity, then the magnetization direction of the storage layer is in the second magnetization direction. If the two metrics are equal then an error in measurement has occurred.

Figure 8:
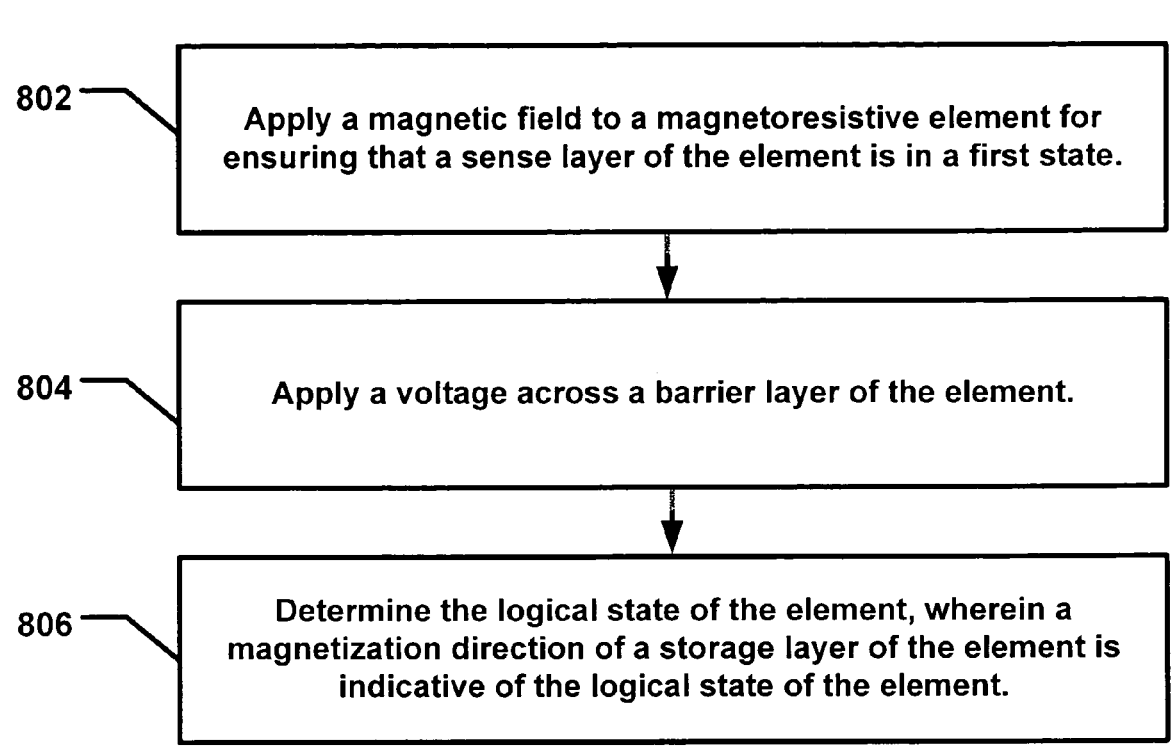
FIG. 8 is a second process flow diagram of a method of reading a binary state.

FIG. 8 shows another embodiment of a read sequence for determining the logical state of the magnetoresistive element. Step 802 involves applying a magnetic field to a magnetoresistive element. The magnetic field is applied in order to ensure that the sense layer of the magnetoresistive element is in a first state. The coercivity of the storage layer should be sufficient to maintain the magnetization direction of the storage layer during the step of applying the magnetic field. Referring to FIG. 5, the first magnetic field should have a magnitude of at least $H_{s1}$ but have a smaller magnitude than $H_1$. Step 804 involves applying a voltage across the barrier layer of the magnetoresistive element. Step 806 involves determining the logical state of the magnetoresistive element. The logical state of the magnetoresistive element is determined from the magnetization direction of the storage layer of the magnetoresistive element. In turn, the magnetization direction of the storage layer may be determined from the resistivity of the magnetoresistive element if the sense layer if the magnetization direction of the sense layer is known. Thus, the step of determining the logical state of the element may comprise passing a current through the barrier layer of the element; and calculating a resistive value of the element.

Preferably, the read sequence is a nondestructive process. This is possible since the magnetization direction of the storage layer is left unchanged.

7. Conclusion

A variety of embodiments have been described above. More generally, those skilled in the art will understand that changes and modifications may be made to these embodiments without departing from the true scope and spirit of the present invention, which is defined by the claims. The drawings have been provided to aid in understanding the invention—the relative scale of various portions of the drawings should not be seen as limiting. Additionally, the various magnetization directions described have been chosen as representative rather than exhaustive. Thus, one skilled in the art will understand that organization of the magnetization directions can be altered without altering performance of the embodiments.

I claim:

1. A method of reading a binary state of a storage layer of a multilayer magnetoresistive tunneling element, the method comprising:
    applying a first externally generated magnetic field in a first direct ion to a sense layer of the tunneling element;
    applying a first voltage perpendicularly across the layers of the tunneling element, the layers comprising a non-magnetic non-conducting barrier layer sandwiched between the storage layer and the sense layer, wherein the applied first voltage is useful in obtaining a first metric indicative of a first resistivity of the tunneling element;
    applying a second externally generated magnetic field in a second direction to the sense layer of the tunneling element, wherein the second direction is opposite to the first direction;
    applying a second voltage perpendicularly across the layers of the tunneling element, wherein the applied second voltage is useful in obtaining a second metric indicative of a second resistivity of the tunneling element; and
    determining the binary state of the storage layer.

2. The method of claim 1, wherein applying the first externally generated magnetic field comprises:
    passing a current through a bit line aligned near the tunneling element; and
    passing a current through a word line aligned near the tunneling element, wherein the first externally generated magnetic field is a composite magnetic field.

3. The method of claim 2, wherein passing a current through a bit line comprises:
    selecting the bit line with a first bit selector interconnected between a first end of the bit line and a bit power source;
    selecting the bit line with a second bit selector interconnected between a second end of the bit line and a ground sink.

4. The method of claim 1, wherein applying the first voltage comprises:
applying a voltage to a bit line coupled to a first side of the tunneling element; and
closing a drain switch interconnected between a second side of the tunneling element and a ground sink, wherein a current passing from the first side of the tunneling element to the second side of the tunneling element passes through the barrier layer of the tunneling element.

5. The method of claim 4, wherein applying a voltage to a bit line comprises closing a read switch interconnected between the bit line and a power source.

6. The method of claim 4, wherein the drain switch is controllable by a select line attached to the drain switch, and wherein closing the drain switch comprises applying a voltage to the select line.

7. The method of claim 1, further comprising:
in response to the application of the first magnetic field, aligning a magnetization direction of the sense layer in a third direction; and
in response to the application of the second magnetic field, aligning the magnetization of the sense layer in a fourth direction.

8. The method of claim 7, further comprising:
in response to the application of the first magnetic field, maintaining a magnetization direction of the storage layer; and
in response to the application of the second magnetic field, maintaining the magnetization direction of the storage layer.

9. The method of claim 7, wherein the first direction is within 30 degrees of the third direction, and wherein the second direction is within 30 degrees of the fourth direction.

10. The method of claim 1, wherein determining the binary state of the storage layer comprises comparing the first metric with the second metric.

11. The method of claim 10, wherein the first metric is a measure of a first current passing through the tunneling element in response to the first voltage, and wherein the second metric is a measure of a second current passing through the tunneling element in response to the second voltage.

12. The method of claim 1, wherein the binary state of the tunneling element is nondestructively obtained.

13. A magnetoresistive tunneling element for storing a bit of data comprising:
a conducting magnetic storage layer having a magnetization direction along an easy axis of the tunneling element, wherein the storage layer is configured to invert the magnetization direction of the storage layer in response to an externally applied magnetic field of at least a first threshold strength, wherein a binary state of the tunneling element is determinable from the magnetization direction of the storage layer;
a conducting magnetic sense layer having a magnetization direction along the easy axis of the tunneling element wherein the sense layer is configured to invert the magnetization direction of the sense layer in response to an externally applied magnetic field of at least a second threshold strength, wherein the second threshold strength is less than the first threshold strength; and
a nonmagnetic nonconducting barrier layer sandwiched between the storage layer and the sense layer.

14. The tunneling element of claim 13, wherein the barrier layer has a thickness of approximately 1 nanometer.

15. The tunneling element of claim 13, wherein a magnetization hysteresis loop of the storage layer is substantially unbiased and wherein a magnetization hysteresis loop of the sense layer is substantially unbiased.

16. The tunneling element of claim 13, wherein the storage layer is thicker than the sense layer.

17. The tunneling element of claim 13, wherein the storage layer has a greater coercivity than the sense layer.

18. The tunneling element of claim 13, further comprising a pair of current drivers, wherein the current drivers are configured to generate a first magnetic field with a strength between the first threshold strength and the second threshold strength during a read sequence for switching the magnetization direction of the sense layer, and wherein the current drivers are further configured to generate a second magnetic field with a strength greater than the first threshold strength during a write sequence for switching the magnetization direction of the storage layer.

19. The tunneling element of claim 13, wherein the storage layer is a magnetizable multilayer.

20. The tunneling element of claim 13, wherein the sense layer is a magnetizable multilayer.

21. A method of reading a magnetoresistive memory element comprising:
applying a magnetic field to the element for ensuring that a sense layer of the element is in a first state, wherein applying the magnetic field to the element includes:
passing a current through a first line arranged near the element for generating a first magnetic field; and
passing a current through a second line arranged near the element for generating a second magnetic field, wherein the first magnetic field is orthogonal to the second magnetic field;
applying a voltage across a barrier layer of the element; and
determining a logical state of the element, wherein a magnetization direction of a storage layer of the element is indicative of the logical state of the element.

22. The method of claim 21, wherein a coercivity of the storage layer is sufficient to maintain the magnetization direction of the storage layer during the step of applying the magnetic field.

23. The method of claim 21, wherein the step of determining the logical state of the element comprises:
passing a current through the barrier layer of the element; and
calculating a resistive value of the element.

* * * * *